(12) United States Patent
Jang et al.

(10) Patent No.: US 8,201,125 B1
(45) Date of Patent: Jun. 12, 2012

(54) NETWORK MAPPING USING EDGES AS A PARAMETER

(75) Inventors: Tetse Jang, San Jose, CA (US); Vi Chi Chan, Pokfulam (HK); Kevin Chung, Toronto (CA)

(73) Assignee: Xilinx, Inc., San Jose, CA (US)

( * ) Notice: Subject to any disclaimer, the term of this patent is extended or adjusted under 35 U.S.C. 154(b) by 457 days.

(21) Appl. No.: 12/366,452

(22) Filed: Feb. 5, 2009

(51) Int. Cl.
*G06F 17/50* (2006.01)
(52) U.S. Cl. .................. 716/116; 716/104; 716/128
(58) Field of Classification Search .................. 716/116
See application file for complete search history.

(56) References Cited

U.S. PATENT DOCUMENTS

| 2005/0235236 | A1* | 10/2005 | Sharma et al. | 716/7 |
| 2008/0195984 | A1* | 8/2008 | Dougherty et al. | 716/2 |

OTHER PUBLICATIONS

Chen et al., "DAG-Map: Graph-Based FPGA Technology Mapping for Delay Optimization", IEEE Design & Test of Computers, Sep. 1992, pp. 7-20.*
Bjesse et al., "DAG-Aware Circuit Compression for Formal Verification", Computer Aided Design, 2004. ICCAD-2004. IEEE/ACM International Conference on, pp. 42-49.*
Mishchenko, Alan et al., "Combinational and Sequential Mapping with Priority Cuts", Proceedings of the Dec. 2007 International Conference on Computer-Aided Design (ICCAD'07), Nov. 5-8, 2007, pp. 354-361, San Jose, California, USA.*
Altera Corp., *Stratix III Device Handbook*, Oct. 2007, pp. 2-5 to 2-7, vol. 1, available from Altera Corporation, 101 Innovation Drive, San Jose, California 95124, USA.
Berkeley Logic Synthesis and Verification Group, "ABC: A System for Sequential Synthesis and Verification," downloaded Jan. 8, 2008 from http://www.eecs.berkeley.edu/~alanmi/abc/abc.htm.
Betz, Vaughn et al., "VPR: A New Packing, Placement and Routing Tool for FPGA Research," *International Workshop on Field Programmable Logic and Applications*, Sep. 1997, London, U.K.
Chatterjee, S. et al., "Reducing Structural Bias in Technology Mapping," *Proceedings of the 2005 International Conference on Computer-Aided Design (ICCAD'05)*, Nov. 6-10, 2005, pp. 519-526, San Jose, California, USA.
Chen, Deming et al., "DAOmap: A Depth-optimal Area Optimization Mapping Algorithm for FPGA Designs," *Proceedings of the 2004 International Conference on Computer-Aided Design (ICCAD'04)*, Nov. 7-11, 2004, pp. 752-759, San Jose, California, USA.
Cong, Jason et al., "FlowMap: An Optimal Technology Mapping Algorithm for Delay Optimization in Lookup-Table Based FPGA Designs," *IEEE Transactions on Computer-Aided Design of Integrated Circuits and Systems*, Jan. 1994, pp. 1-12, vol. 13, No. 1.
Cong, Jason et al., "Cut Ranking and Pruning: Enabling a General and Efficient FPGA Mapping Solution," *Proceedings of the 7th ACM International Symposium on Field-Programmable Gate Arrays (FPGA'99)*, Feb. 21-23, 1999, pp. 29-35, Monterey, California, USA.
Gupta, Subodh et al., "CAD Techniques for Power Optimization in Virtex-5 FPGAs," *Proceedings of the IEEE Custom Integrated Circuits Conference (CICC'07)*, Sep. 16-19, 2007, pp. 85-88.

(Continued)

*Primary Examiner* — Paul Dinh
*Assistant Examiner* — Bryce Aisaka
(74) *Attorney, Agent, or Firm* — W. Eric Webostad; Kevin T. Cuenot

(57) ABSTRACT

A method and apparatus for circuit design synthesis are described. An edge flow cost function is implemented to obtain edge flow costs for nodes of a network. A subject graph of the network is then mapped using the edge flow costs.

12 Claims, 6 Drawing Sheets

```
                                                                        600
                                                                       ↙ globalAreaEdgeRecovery( aig, K )  ←—601
            {
               computeTargetedTimes( aig );  ←—602
               for each aig node n in topological order {  ←—603
                  cuts = findCutsMinimizingAreaFlow( n );  ←—604         }630
                  repres_cut = findCutMinimizingEdgeFlow( cuts );  ←—605
                  setLevel( n, getLevel( repres_cut ) );  ←—606
                  setRepresentativeCut( n, repres_cut );  ←—607
               }
            }
            edgeFlow( cut )  ←—608
            {
               edgeflow = numLeaves( cut );  ←—609
               for each leaf of cut {  ←—610
                  fanouts = nodeFanouts (leaf );  ←—611
                  if ( fanouts == 0 )    ⎫
                     fanouts = 1;        ⎬612                    613⌐      }620
                  edgeflow += EdgeFlow( nodeReprCut(leaf) ) / fanouts;
               }
               setEdgeFlow( cut, edgeflow );  ←—614
               return edgeflow;  ←—615
            }
```

OTHER PUBLICATIONS

Hutton, Mike et al., "Improving FPGA Performance and Area Using an Adaptive Logic Module," *LNCS 3203*, Aug. 30, 2004, pp. 135-144, available from Altera Corporation, 101 Innovation Drive, San Jose, California 95124, USA.

Lehman, Eric et al., "Logic Decomposition During Technology Mapping," *IEEE Transactions on Computer-Aided Design of Integrated Circuits and Systems*, Aug. 1997, pp. 813-834, vol. 16, No. 8.

Manohararajah, Valavan et al., "Heuristics for Area Minimization in LUT-Based FPGA Technology Mapping," *IEEE Transactions on Computer-Aided Design of Integrated Circuits and Systems*, Nov. 2006, pp. 2331-2340, vol. 25, No. 11.

Mishchenko, Alan et al., "Combinatorial and Sequential Mapping with Priority Cuts," *Proceedings of the 2007 International Conference on Computer-Aided Design (ICCAD'07)*, Nov. 5-8, 2007, pp. 354-361, San Jose, California, USA.

Mishchenko, Alan et al., "DAG-Aware AIG Rewriting: A Fresh Look at Combinatorial Logic Synthesis," *Proceedings of the 43rd Design Automation Conference (DAC'06)*, Jul. 24-28, 2006, pp. 532-536, San Francisco, California, USA.

Mishchenko, Alan et al., "Improvements to Technology Mapping for LUT-Based FPGAs," *Proceedings of the 7th ACM International Symposium on Field-Programmable Gate Arrays (FPGA'06)*, Feb. 22-24, 2006, pp. 41-49, Monterey, California, USA.

Mischchenko, Alan et al., "SAT-Based Logic Optimization and Resynthesis," *Proceedings of the 16th International Workshop on Logic and Synthesis (IWLS'07)*, May 30-Jun. 1, 2007, pp. 358-364, San Diego, California, USA.

Murgai, Rajeev et al., "Logic Synthesis for Programmable Gate Arrays," *Proceedings of the 27th Design Automation Conference (DAC'90)*, Jun. 24-28, 1990, pp. 620-625, Orlando, Florida, USA.

Pan, Peichen et al., "A New Retiming-based Technology Mapping Algorithm for LUT-based FPGAs," *Proceedings of the 6th ACM International Symposium on Field-Programmable Gate Arrays (FPGA'98)*, Feb. 22-24, 1998, pp. 35-42, Monterey, California, USA.

Sentovich, Ellen et al., "SIS: A System for Sequential Circuit Synthesis," Memorandum No. UCB/ERL M92/41, available from the Department of Electrical Engineering and Computer Science, University of California Berkeley, Berkeley, California, USA.

Xilinx, Inc., "Achieving Higher System Performance with the Virtex-5 Family of FPGAs," White Paper WP245 (v1.1.1), Jul. 7, 2006, available from Xilinx, Inc., 2100 Logic Drive, San Jose, California 95124, USA.

Jang, Stephen et al., "WireMap: FPGA Technology Mapping for Improved Routability," *Proc. of the 16th ACM/SIGDA International Symposium on Field-Programmable Gate Arrays*, Feb. 24, 2008, pp. 1-9, ACM, USA.

\* cited by examiner

```
Map( aig, K)  ←—201
{
    MapCutEnumeration( aig, K );    ←—202
    MapDepthOriented( aig, K );     ←—203
    MapAreaRecovery( aig, K );      ←—204
    MapDeriveFinalMapping( aig, K ); ←—205
}
```

FIG. 2
(Prior Art)

```
MapDepthOriented( aig )  ←—301
{
    for each aig node n in topological order {
        cut = findCutMinimizingDepth( n );
        setLevel( n, getLevel(cut) );              ⎬—302
        setRepresentativeCut( n, cut );
    }
}
getLevel( cut )  ←—303
{
    level_max = -∞;
    for each node m in cut
        level_max = max( level_max, getLevel(m) ); ⎬—304
    return 1 + level_max
}
```

FIG. 3
(Prior Art)

```
MapAreaRecovery( aig, K )  ←—401
{
    computeTargetedTimes( aig );
    for each aig node n in topological order {
        cut = findCutMinimizingAreaFlow( n );       ⎫
        setLevel( n, getLevel( cut ) );             ⎬ 402
        setRepresentativeCut( n, cut );             ⎭
    }
    computeTargetedTimes( aig );
    for each aig node n in topological order {
        cut = findCutMinimizingExactLocalArea( n ); ⎫
        setLevel( n, getLevel( cut ) );             ⎬ 403
        setRepresentativeCut( n, cut );             ⎭
    }
}
```

FIG. 4
(Prior Art)

```
MapDeriveFinalNetwork( aig, K )  ←—501
{
    M = POs;  F = POs   ←—502
    while ( F ≠ ∅ ) {
        n = getExtractNode( F );
        cut = getCut( n );
        for each node m in cut {    ⎫
            if ( m ∈ M or m ∈ PIs ) ⎬ 503
                continue;           ⎪
            M = M ∪ m;  F = F ∪ m;  ⎭
        }
    }
    return M;  ←—504
}
```

FIG. 5
(Prior Art)

```
localAreaEdgeRecovery( aig, K )   ←―701
{
    for each aig node n in topological order {   ←―702
        cuts = findCutsMinimizingExactArea( n );   ←―703
        repres_cut = findCutMinimizingExactEdge( cuts );   ←―704
    }
}
exactEdgeCount( cut )   ←―705
{
    if ( cutIsRepresentative( cut ) );   ←―706
        edges1 = exactEdgeCountDeref( cut );   ←―707
        edges2 = exactEdgeCountRef( cut );   ←―708
    } else {
        edges2 = exactEdgeCountRef( cut );   ←―710
        edges1 = exactEdgeCountDeref( cut );   ←―709
    }
    assert( edges1 == edges2 );   ←―711
    return edges1;   ←―712
}
exactEdgeCountRef( cut )   ←―713
{
    edges = numLeaves( cut );   ←―714
    for each leaf of cut   ←―715
        nodeDecrementRefCounter( leaf );   ←―716
        if ( nodeRefCounter( leaf ) == 0 && !nodeIsPi( leaf ) )
            edges += exactEdgeCountRef( nodeReprCut(leaf) );   }717
    }
    return edges;   ←―718
}
exactEdgeCountDeref( cut )   ←―719
{
    edges = numLeaves( cut );   ←―720
    for each leaf of cut   ←―721
        if ( nodeRefCounter( leaf ) == 0 && !nodeIsPi( leaf ) )
            edges += exactEdgeCountDeref( nodeReprCut(leaf) );   }722
        nodeIncrementRefCounter( leaf );   ←―723
    }
    return edges;   ←―724
}
```

FIG. 7

```
wireMap( aig, K )    ◄─── 801
{
    MapCutEnumeration( aig, K );      ◄─── 802
    MapDepthOriented( aig, K );       ◄─── 803
    globalAreaEdgeRecovery( aig, K ); ◄─── 804
    localAreaEdgeRecovery( aig, K );  ◄─── 805
    MapDeriveFinalMapping( aig, K );  ◄─── 806
    performLUTMerging( aig, K );      ◄─── 807
}
```

NETWORK MAPPING USING EDGES AS A PARAMETER

FIELD OF THE INVENTION

The invention relates to integrated circuit devices (ICs). More particularly, the invention relates to network mapping using edges as a parameter for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As is known, an integrated circuit design may be instantiated in programmable logic of an FPGA responsive to a configuration bitstream. An integrated circuit design may have combinational logic, and this combinational logic of a circuit design may be represented as a Boolean network. Such a Boolean network may be depicted as a directed acyclic graph ("DAG") with vertices or nodes corresponding to logic gates and directed edges corresponding to routing wires, where the routing wires interconnect the logic gates of the circuit design. A node in a DAG may have zero or more than zero fanins, where each fanin may have a driver for driving a load into such a node. Moreover, a node in a DAG may have zero or more than zero fanouts, namely loads driven by and from such a node. Primary inputs ("PIs") are nodes without fanins and primary outputs ("POs") are nodes without fanouts. Of course, not all circuit designs are composed entirely of combinational logic, as some circuit designs include sequential or clocked logic, such as registers. Sequential logic inputs to and outputs from registers, for example, may be respectively treated as additional PIs and POs, respectively, for reduction and mapping of combinational logic of the circuit design.

SUMMARY OF THE INVENTION

One or more aspects generally relate to network mapping using edges as a parameter for an IC.

An aspect relates generally to a method for circuit design synthesis. The method includes implementing an edge flow cost function to obtain edge flow costs for nodes of a network, and mapping of a subject graph of the network using the edge flow costs.

Another aspect relates generally to a method for mapping for circuit design synthesis. The method includes: obtaining a subject graph having nodes representing a network; determining cuts for each of the nodes, determining a minimum depth cut from the cuts for each of the nodes; assigning the minimum depth cut respectively associated with each of the nodes as a representative cut thereof; updating the representative cut of each of the nodes; the updating including running at least one routine selected from a group consisting of a global area edge recovery routine and a local area edge recovery routine; and outputting a set of the nodes for use in the mapping.

Yet another aspect relates generally to a machine-readable medium having stored thereon information representing instructions that, when executed by a processor, cause the processor to perform operations including: obtaining a subject graph having nodes representing a network; determining cuts for each node of the nodes; determining a minimum depth cut from the cuts for each said node of the nodes; assigning the minimum depth cut associated with each said node as a representative cut thereof; updating the representative cut of each said node; the updating including running at least one routine selected from a group consisting of a global area edge recovery routine and a local area edge recovery routine; and outputting a set of the nodes for use in mapping.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 2 is a pseudo-code listing depicting an exemplary embodiment of a conventional mapping of a circuit design, such as to the FPGA of FIG. 1.

FIG. 3 is a pseudo-code listing depicting an exemplary embodiment of a conventional depth-oriented mapping.

FIG. 4 is a pseudo-code listing depicting an exemplary embodiment of a conventional area recovery.

FIG. 5 is a pseudo-code listing depicting an exemplary embodiment of a conventional mapping to derive a final look-up table ("LUT").

FIG. 7 is a pseudo-code listing depicting an exemplary embodiment of an exact local edge reduction flow.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
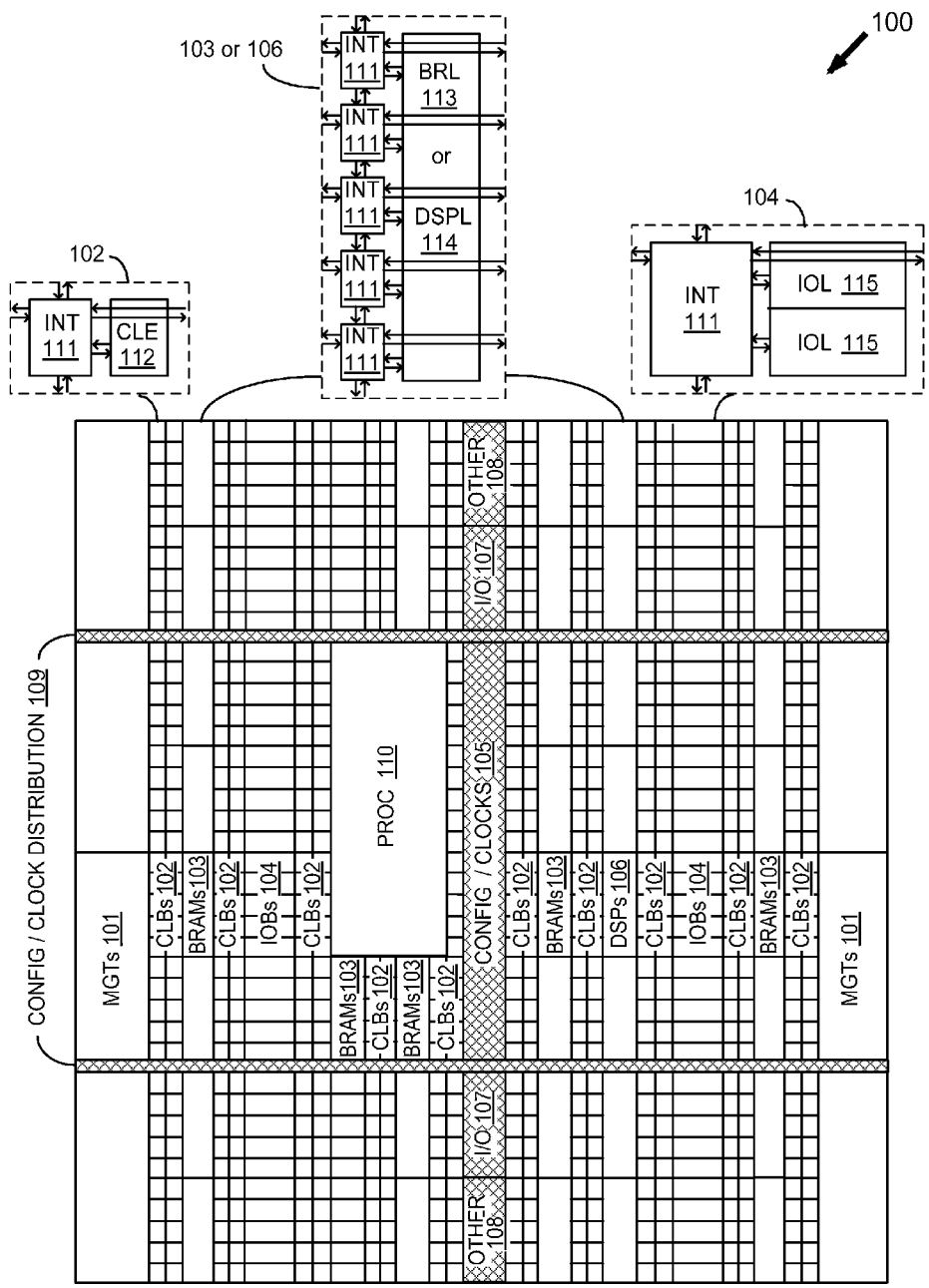
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

A mapper that uses an edge flow heuristic to improve routability of a mapped integrated circuit design is described. The edge flow heuristic may be applied during an iterative mapping optimization to reduce the total number of pin-to-pin connections ("edges"), namely to reduce the total number of edges. Even though the total number of edges may be reduced, look-up table ("LUT") depth and count of a mapping of a circuit design to an FPGA may be maintained.

After mapping, a resulting network list of components ("netlist") may be used for placement and routing with an overall reduction in total wire length. Furthermore, reductions in minimum channel width and critical path delay may result from the improved routability obtained by using an edge flow heuristic as described herein. Additional advantages may be obtained by reducing an average number of inputs of LUTs without increasing the total LUT count and depth. For example, percentages of 5- and 6-input LUTs may be reduced, while percentages of 2-, 3-, and 4-input LUTs are increased. The smaller LUTs, namely the 2-, 3-, and 4-input LUTs, may be merged into pairs and implemented using dual output LUT structures, which are found in some FPGAs. Accordingly, a mapper as described herein may lead to a reduction in dual-output LUTs after such merging.

Mapping a circuit design to an FPGA transforms what was potentially a technology-independent logic network ("network"), sometimes referred to as a subject graph, into a logic of nodes with no more than K inputs, for K a positive integer equal to a maximum number of inputs of a node, such as a maximum number of inputs of a LUT. Each node in such network of logic nodes may be represented using a K-input LUT. Such a K-input LUT may be used to implement any Boolean function for up to K inputs. The subject graph may be a network composed of 1-input and 2-input logic gates, such as in an AND-Inverter Graph ("AIG") representation of a network.

To map a subject graph into K-input LUTs, "cut enumeration" may be used. In cut enumeration, a subject graph is traversed in topological order. Each time a node is visited, cuts are computed. A simple cut consists only of the node itself. A more complex cut is a set of nodes in a transitive fanin of a node blocking all paths from the PIs to the node. A K-feasible cut may be a cut that is implemented by a K-input LUT.

LUT sizes used in present-day FPGAs are conventionally 4-, 5-, and 6-input LUTs. During mapping of a circuit design, each cut may be ranked using one or more cost functions. Examples of cost functions include the number of levels, namely the delay from a PI to a node associated therewith, and area, namely the number of LUTs in one or more transitive fanins. As shall be understood more clearly from the following description, cost functions for calculating one or more edges of a mapped network are described. Cost functions using edges with cut-enumeration edge heuristics, namely "edgeflow" and "exact edge recovery." Use of these edge heuristics allow for a significant reduction in edges in a final mapped network, when placed and routed, a resulting logic network may have a significant total wirelength reduction for a targeted channel width.

A cut-based structural mapping for K-input LUTs may be applied to subject graphs that are K-bounded. By K-bounded, it meant that the number of fanins of any node in such subject graph does not exceed K. It should be understood that a network may be decomposed to create a K-bounded subject graph suitable for mapping.

An "edge" in a subject graph is a connection between two nodes that have a fanin to fanout relationship with each other. An "edge count" of a subject graph is the total number of edges in such subject graph. For a given node n, a cut may be for a set of nodes of a network. The nodes of such a cut formed set may be called "leaves." Thus every path from a PI to n passes through at least one leaf. A cut "covers" a root node n, as well as all nodes found on the path from the leaves to the root node, excluding the leaves. A cut may be said to be "K-feasible" if the number of leaves in such cut does not exceed K. A cut C1 may be said to be "dominated" if there is another cut C2 of the same node which is contained in such cut C1.

A "fanin cone" or a "fanout cone" of a node n is a subset of all nodes of a network reachable through transitive fanin edges or transitive fanout edges, respectively, from such a node n. A "maximum fanout free cone" ("MFFC") of a node n is a subset of a fanin cone for such node n, such that every path from a node in the subset to the POs passes through node n.

The "level" of a node is the number of nodes on the longest path from any PI to such a node. For determining the level of a node, the node itself is counted, but the PIs to such a node are not counted. Furthermore, network "depth" is the largest level of any internal node in a network.

A mapping selects one K-feasible cut, namely a representative cut, for each internal node of a subject graph. Additionally, as part of the mapping, a subset of nodes, whose representative cuts cover all non-PI nodes in the Boolean network associated with such subject graph, is computed and incrementally updated. Such a subset of nodes is said to be "used" in the mapping.

A starting mapping may be found by assigning one K-feasible cut at each node in a network. The mapping may then be iteratively updated by performing several optimization passes over the network. Each of such passes may selectively modify the representative cut of a node, one node at a time, where changes are propagated to other nodes of the network. Each such modification generally changes the set of nodes "used" in the mapping. Such changes may propagate recursively from a node towards the PIs of such node. The "area" of a mapping is the number of nodes used in the mapping.

With the above-described nomenclature as a reference, FIGS. 2 through 8 are described. FIG. 2 is a pseudo-code listing depicting an exemplary embodiment of conventional mapping 200 of a circuit design, such as to an FPGA 100 of FIG. 1. Mapping 200 is initialized for a K-bounded AIG as a conventional or traditional mapping at 201. At 202, all K-feasible cuts are computed for each node of such AIG and saved for such K-bounded AIG. At 203, a minimum depth cut is assigned to be a representative cut at all nodes for such K-bounded AIG.

At 204, the representative cut is updated at each node to save area or "semiconductor real estate." Lastly, at 205, a set of nodes used in the final mapping of such AIG is returned or output for the K-bounded AIG.

For further understanding cut enumeration, suppose A and B are two sets of cuts. For purposes of convenience, the operation $A \diamond B$ may be defined as follows:

$$A \diamond B = \{u \cup v | u \in A, v \in B, |u \cup v| \leq K\}. \qquad (1)$$

In other words, for every cut (u) in set A and every cut (v) in set B, the union operation is applied, and the resulting cut is kept in $A \diamond B$ if it is K-feasible.

Letting $\Phi(n)$ denote the set of K-feasible cuts of a node n, then if n is an AND node, $n_1$ and $n_2$ may be used to denote fanins of node n. The set of cuts of node n may be computed using sets of cuts of fanins of such node n as follows:

$$\Phi(n) = \begin{cases} \{\{n\}\} & : n \in PI \\ \{\{n\}\} \cup \Phi(n_1) \diamond \Phi(n_2) & : \text{otherwise} \end{cases}. \qquad (2)$$

Using Equations (1) and (2), all K-feasible cuts of all nodes may be computed in a single traversal from the PIs to the POs of an AIG. Performing cut computation in a topological order may ensure that fanin cuts, $\Phi(n_1)$ and $\Phi(n_2)$, are available when node cuts, $\Phi(n)$, are computed. The cut set of an AND node may be computed by merging two cut sets of children of such AND node as previously described and adding a simple cut, namely a cut composed only of the node itself while keeping only K-feasible cuts. Furthermore, computed cuts may be filtered dynamically by removing dominated cuts to reduce runtime and memory usage without unnecessarily compromising quality of a mapping.

For depth-oriented mapping, it may be assumed that all cuts of all nodes of an AIG are computed by the previously described cut enumeration procedure. Thus a depth-oriented mapping may be derived by traversing the nodes in a topological order, and at each node, finding a cut that minimizes the level of such a mapping. This cut that minimizes the level of the mapping along with the value of the level may be stored at or in association with the node. The level of such a cut may computed by adding 1 to the largest level of the cut leaves.

FIG. 3 is a pseudo-code listing depicting an exemplary embodiment of a conventional depth-oriented mapping 300. Depth-oriented mapping 300 is initiated at 301 for an AIG. For each AIG node n, a cut minimizing depth is determined in nodal topological order with setting of level and setting of the representative cut as generally indicated at 302.

At 303, determining the level of the cut in 302 is initiated. The level of the cut may be obtained by setting a maximum level, and for each node in a cut, the maximum level may be updated as generally indicated at 304.

Depth-oriented mapping 300 computes a LUT mapping whose depth is a minimum for the LUT size and the logic structure of the subject graph being processed. Depth minimization of each and every path from the PIs to the POs of an AIG leads to a phenomenon known as "area duplication." Area duplication is when some AIG nodes are covered by more than one cut, which leads to an increased LUT count. This increased LUT count may be addressed by an area recovery phase performed after depth-oriented mapping 300.

FIG. 4 is a pseudo-code listing depicting an exemplary embodiment of a conventional area recovery 400. Area recovery 400 is initiated at 401 for a K-bounded AIG. Area recovery 400 includes two heuristics, namely "area flow" 402 and "exact local area" 403.

Area flow 402 effectively has a "global view" of a network for selecting logic cones with "more" shared logic. Exact local area 403 effectively provides a "local view" of a network for minimizing the area more specifically at each node. These global and local view heuristics are described in additional detail below.

Area flow 402, sometimes referred to as "effective area", is an extension of the notion of "area." Again, as previously described, "area" of a mapping is the number of nodes used in the mapping. Area flow 402 may be computed in one pass over a network from the PIs to the POs processing each node n in turn in topological order. Area flow ("AF") of PIs may be set to 0, and thus area flow of a node n may be computed as follows:

$$AF(n) = \frac{\left[ \text{Area}(n) + \sum_i AF(Leaf_i(n)) \right]}{NumFanout(n)}, \quad (3)$$

where Area(n) is the area cost of a LUT used to map a current cut of a node n; $Leaf_i(n)$ is an i-th leaf of such a cut at such a node n; and NumFanout(n) is the number of fanouts of such a node n in a currently selected mapping. If a node is not used in a current mapping, then for purposes of area flow 402 computation, fanout count for such a node may be assumed to be equal to one.

If nodes in an AIG are processed from the PIs to the POs, area flow 402 may be computed in a relatively short time. Thus, it should be appreciated that area flow 402 is a global view of how useful the logic in a cone is for a current mapping. In other words, area flow estimates sharing between cones, and this estimation may be performed without having to re-traverse such cones.

Exact local area 403 is for a local view of a network, as exact local area of a node is the area added to a mapping by using a current node in the mapping. The "exact area" of a cut may defined as the sum of areas of the LUTs in the MFFC of such a cut, namely the LUTs added to the mapping if the cut is set at the representative cut of such a node.

The exact area of a cut may be computed using a fast local depth first search ("DFS") traversal of a subject graph starting from a root node of a cut. A reference counter of a node in a subject graph is set equal to the number of times such a node is used in a current mapping or is used as a PO. The number of times a node is used in a current mapping is the number times such node appears as a leaf of a representative cut of some other node. The exact area computation may be called for each cut. The exact area computation adds a cut area to a local area being computed, dereferences the cut leaves, and recursively calls itself for representative cuts of leaves whose reference counts are zero.

Exact local area 403 may occur as many times as there are LUTs in an MFFC of a cut for which such heuristic is called. However, conventionally this number is relatively small and thus computing exact area may be done in a relatively short time. Once exact local area is computed, a similar recursive referencing may be performed to reset reference counters to their initial values before computing an exact local area for another cut.

FIG. 5 is a pseudo-code listing depicting an exemplary embodiment of a conventional mapping 500 to derive a final LUT. Mapping 500 is for a K-bounded AIG. Mapping 500 is initiated at 501. At 502, mapped nodes ("M") and the "frontier" ("F") to the PO nodes are set. At 503, each node in the frontier is explored for cuts. The outcome of 503 is a set of nodes to be used in a final mapping, where each of the nodes may be implemented using a single K-input LUT. Mapping 500 assumes that one K-feasible representative cut is assigned at each node.

Two sets of AIG nodes are supported, namely the nodes used in the mapping ("M") and the nodes currently in the frontier ("F"). Both of these sets are initialized to the set of POs.

While the frontier is not empty, one node (n) is extracted from such frontier. A representative cut of such a node is computed, and the leaves of this cut are explored. If a leaf (m) already belongs to the mapping, M, or is a PI, this leaf is skipped; otherwise the leaf is added to both the mapping and the frontier. When the frontier is empty, mapping 500 at 504 returns the set M of nodes used in the mapping.

In contrast to the prior art as described above with reference to FIGS. 2 through 5, edge count may be used, in addition to, or as a replacement of area, as a cost function. In a mapped network of LUTs, a total number of edges may be determined by summing up the total number of input pins utilized by all of such LUTs. As each cut of a subject graph is evaluated, the total number of cumulative utilized edges may be determined should a respective cut be selected. Application of mapping edges in conjunction with area flow and exact area recovery mapping heuristics or algorithms as described below may produce a significant improvement in a mapped network, when such mapped network is placed and routed. Because the metric is edges, the heuristics are termed "edge flow" and "exact edge recovery."

In contrast to predicting global LUT counts for having a mapping optimization that picks cuts with lowest area during a matching phase, an edge flow heuristic predicts the total number of edges in a transitive fanin of a node. By minimizing the total number of edges, the number of wires during placement and routing is reduced, and hence routability is enhanced.

An edge flow ("EF") cost function may be defined as follows:

$$EF(n) = \frac{\left[ \text{Edge}(n) + \sum_i EF(Leaf_i(n)) \right]}{NumFanout(n)}, \quad (4)$$

where Edge(n) is a total number of fanin edges of a LUT used to map a current representative of node n; $Leaf_i(n)$ is an i-th leaf of the representative cut of node n; and NumFanouts(n) is a number of fanouts of node n in a currently selected mapping.

Figure 6:
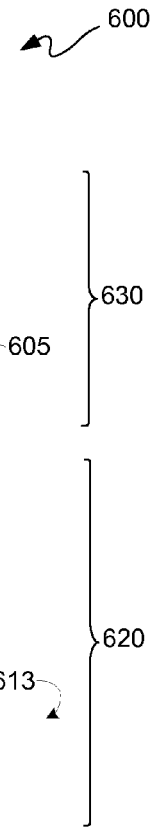
FIG. 6 is a pseudo-code listing depicting an exemplary embodiment of a global area/edge recovery algorithm.

FIG. 6 is a pseudo-code listing depicting an exemplary embodiment of a global area/edge recovery algorithm 600. Algorithm 600, in contrast to area recovery 400 of FIG. 4, focuses on global edge reduction only. During global edge reduction, instead of only finding one cut that has the minimum area flow, all cuts with the same minimum area flow are found. If there is a tie among two or more cuts, algorithm 600 selects a cut of such cuts with the lowest edge flow as the representative cut.

Algorithm 600 is initiated at 601 for a K-bounded AIG. At 602, computation of times for target timings for a network represented by such AIG is initiated. Such computation initiated at 602 may be for each AIG node n progressing in a topological order, as generally indicated at 603.

At 604, cuts minimizing area flow are found for each such node n of an AIG. At 605, the cuts found at 604 are evaluated to determine which of those cuts minimize edge flow, namely minimize edge count. At 606, the cuts determined at 605 to minimize edge flow are evaluated to determine the level of each cut associated with such node being processed, and thus the level for a node may be set or stored at 606. Again, the level is a number of the nodes on a longest path of the network from a primary input of the network to said node, and the primary input is a node without any fanin. Additionally, for each node n processed, the one or more cuts found at 605 are evaluated to set a representative cut at 607. Again, the representative cut set or stored at 607 is the one with the lowest edge flow for such node n.

At 608, an edge flow computation for a cut is initiated and may be called at 605. Thus, the cut used may be the cut currently being evaluated at 605.

At 609, the number of leaves for such cut is determined and stored as a temporary edge flow value. For each leaf of the leaves of such a cut, the leaf nodes are visited as generally indicated at 610. The number of fanouts for each leaf node is determined as generally indicated at 611. A fanout counter is adjusted to be equal to one if a leaf node has no fanouts, as generally indicated at 612. If a leaf node has no fanouts this means that the leaf is not used in the current mapping being processed.

At 613, an edge flow value of a representative cut of a leaf is determined by recursively augmenting a partial result edge flow value by adding the edge flow contribution of each leaf of the representative cut, as follows. A representative cut for a leaf node, which is a function of the edge flow, is divided by the value of a fanout thereof. Thus, each edge flow value contributed by each leaf is respectively divided the number of fanouts of that leaf, and the result of this division is an interim edge flow value or partial result. The interim edge flow value contributed by each leaf is summed to provide a part of the total value of a resultant edge flow value. The other part of the total is the edge flow value set at 609. These parts of the total are added to provide a resultant edge flow value.

At 614, a resultant edge flow is set for the cut with the value determined at 613. At 615, edge flow subroutine 620 returns to 605 with an "edgeflow" value. Thus it should be appreciated that algorithm 600 includes an area edge recovery subroutine 630, having steps 601 through 607, and an edge flow subroutine 620, having steps 608 through 615. Subroutines 630 and 620 in combination provide a global view heuristic.

The exact local edge count of a node is the edge count added to a mapping by selecting a current node as the node used in such mapping. The exact count of a cut is defined as the sum of edge counts of the LUTs in the MFFC of the cut, namely the LUTs to be added to the mapping if the cut is selected as the representative cut. Thus a local view heuristic may be used for an exact local edge reduction, as described in additional detail with reference to FIG. 7.

FIG. 7 is a pseudo-code listing depicting an exemplary embodiment of an exact local edge reduction flow 700. In exact local edge reduction flow 700, computation of combined exact area and edge recovery is used. Again, nodes are considered in topological order, and for each node, cuts minimizing exact area are computed. If there is a tie among such cuts for minimizing exact area, the cut minimizing the exact edge count is selected.

Exact local edge flow 700 is initiated at 701 for a K-bounded AIG. Each node n for an AIG is processed in topological order as generally indicated at 702. At 703, cuts minimizing exact area for each node are determined. At 704, the cuts determined at 703 are used for selecting a representative cut, namely a cut that minimizes an exact edge count or value.

The subroutine for determination of exact edge count for a cut, namely exact edge count subroutine 730, is initiated at 705. If a cut is selected as a representative cut as generally indicated at 706, then there are two settings for the cut, namely edge setting 1 (e.g., "edges1") and edge setting 2 (e.g., "edges2"). Edge setting 1 is for a "dereferencing exact edge count" for such representative cut and edge setting 2 is for a "reference exact edge count" for such representative cut, as respectively indicated at 707 and 708. The subroutines that are called for exact edge count dereferencing and exact edge count referencing are described below in additional detail.

If as determined at 706 the cut being processed for an exact edge count at 705 is not a representative cut, then edge setting 1 and edge setting 2 are swapped from that previously described. In other words, edge setting 1 is for a dereferencing exact edge count and edge setting 2 is for a referencing exact edge count for such cut as generally indicated at 709 and 710, respectively. At 711, edge setting 2 is set to edge setting 1, and at 712, an edge setting 1 value is returned from whence exact edge count subroutine 730 was called.

It should be appreciated that exact edge count subroutine 730 is recursive. Computation in exact edge count subroutine 730 varies depending on whether or not a cut as used in the mapping presently being processed is a representative cut of a node. If a cut is a representative cut of a node that is used in the current mapping, such node is referenced and so are the leaves of the representative cut of such node. Computation of exact edge count is operable on leaves responsive to first referencing such leaves. If a reference counter of a leaf becomes zero, such recursive computation of exact edge count subroutine 730 is used for such leaf. If the reference counter does not become zero, the leaf is skipped. Because edges of a representative cut of a leaf are added towards a total leaf count, if a leaf participates in a current mapping only through a current cut, the leaf may be skipped. If, however, a cut is not a representative cut, then dereference and reference values for a node are swapped.

After calling subroutine 730 for an exact edge count, or alternatively for an exact area count as described below in additional detail, which dereferences or references a node being processed, a corresponding referencing or dereferencing, respectively, a subroutine may be called. Such a called subroutine may restore the original reference counters of the node, or more particularly of the leaf nodes, and this subroutine is referred to herein as exact edge count reference subroutine 731. Referencing the exact edge count for a cut for exact edge count reference subroutine 731 is initiated at 713. The number of leaves for such cut is set equal to the edges value as generally indicated at 714.

A depth-first traversal of the network rooted at the cut is performed to determine the number of leaves of a cut. For each leaf of a cut, namely visiting each of the leaf nodes of a cut as generally indicated at 715, node decrementing of a reference counter for such leaf is performed as generally indicated at 716. If the node reference counter for a leaf is equivalent to zero and the node is a PI for such leaf, then the edges value set at 714 is incremented, as generally indicated at 717. The exact edge count reference is a function of the node representative cut for the leaf for this incrementing.

At 718, an exact edge count value is returned from whence subroutine 731 was called. Exact edge count reference subroutine 731 may be called either from 708 or 710 by exact edge count subroutine 730.

Exact edge count dereference subroutine 732 is called either at 707 or 709 by exact edge count subroutine 730. Exact edge count dereference subroutine 732 is initiated at 719 for a cut. At 720, the number of leaves in such cut is set equal to the edges value. For each leaf of a cut, the leaf nodes of such cut are visited as generally indicated at 721. If the node reference count of a leaf is equal to zero and the node is a PI of the leaf, then the exact edges counter for dereferencing is incremented as generally indicated at 722. The exact edge count for dereferencing is a function of the node being a representative cut of the leaf. At 723, the node increment reference counter for such leaf is incremented. At 724, a current value for the edge count is returned from whence it was called, namely either to 707 or 709 as described above.

In other words, for each leaf, it is determined whether its transitive fanout goes to only the cut. If the leaf's transitive fanout goes only to the cut, the exact edge count is recursively determined, where an edge value for each leaf of the representative cut is determined. The contribution of each edge value for each of the leaves is added for determining an exact edge value or count of the representative cut.

Even though exact local edge reduction flow 700 has been described in terms of edges as a local view heuristic, it should be appreciated that the exact local area of a node may alternatively be determined. Again, the exact local area of a node is the area added to a mapping by selecting a current node as the one used in the mapping. The exact area of a cut is defined as the sum of the areas of LUT(s) in the MFFC of such cut, namely the LUT(s) to be added to the mapping if the cut is selected as the representative cut. Furthermore, it should be understood that when a representative cut of a node is updated, the prior cut is dereferenced prior to referencing the new cut. In other words, after the old cut is dereferenced the new cut is referenced. This is done to ensure that at any time only the nodes used in the mapping are being referenced, and the sum total of the exact local areas or exact local edge counts of these nodes is the exact local area or the exact local edge count, respectively, of the mapping.

Figures 8, 9:
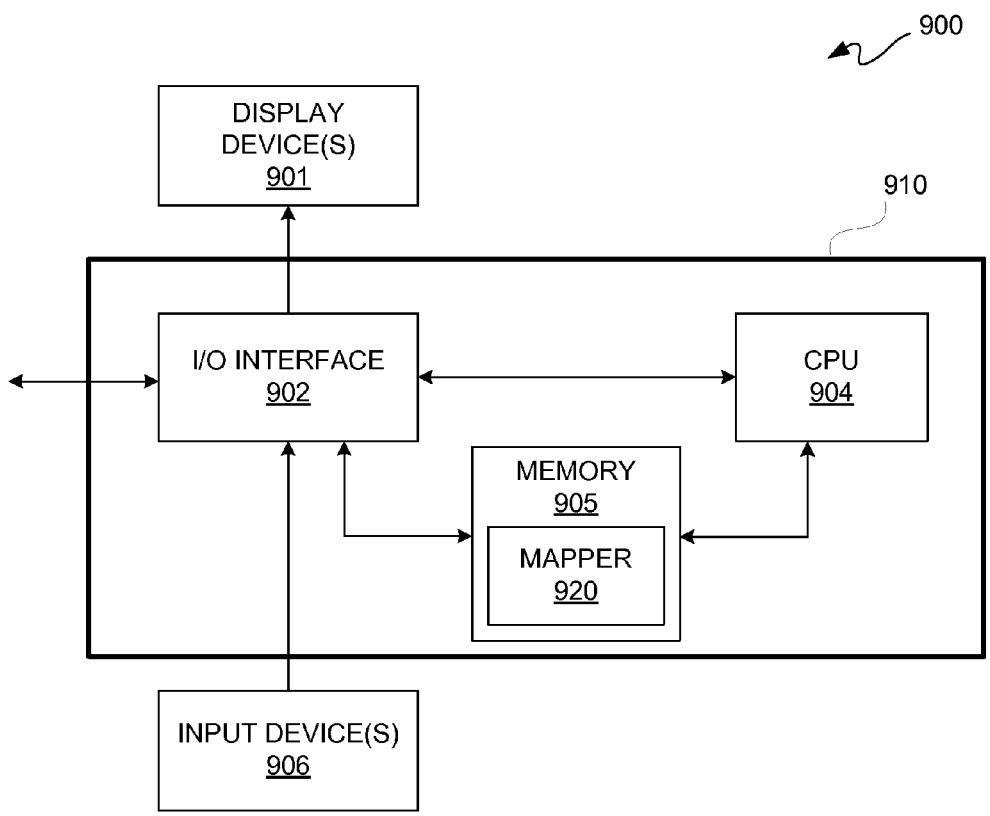
FIG. 8 is a pseudo-code listing depicting an exemplary embodiment of a wire mapping ("WireMap") flow.
FIG. 9 is a block diagram of an exemplary embodiment of a computer system.

FIG. 8 is a pseudo-code listing depicting an exemplary embodiment of a wire mapping ("WireMap") flow 800. WireMap flow 800 is a mapping algorithm utilizing a combination of area optimization and edge optimization, such as for providing a depth-optimized circuit.

WireMap algorithm for a K-bounded AIG is initiated at 801. At 802, a map cut enumeration for such K-bounded AIG is computed for all K-feasible cuts at each node, and such cuts are saved. The operation generally indicated at 802 may be performed in a known manner. At 803, a minimum depth cut is assigned as a representative cut at each node of the K-bounded AIG. Depth-oriented mapping at 803 may be performed in a known manner.

At 804 and 805, the representative cut at each node is updated to save area. More particularly, for the K-bounded AIG, global area edge recovery flow 600 is called at 804, and exact local area edge reduction flow 700 is called at 805.

In flow 800, edge count is used as an additional cost function when selecting a cut. In flow 800, an area or edge flow is used as a first or second tiebreaker, in a first pass when a delay optimum mapping is computed. When a global heuristic is applied, such as at 804, area flow becomes the primary cost function and edge flow a tiebreaker used to choose among cuts, such as cuts whose arrival times do not exceed targeted times. When a local view heuristic is called at 805, the exact area becomes the primary cost function and the exact edge count becomes the tiebreaker used to choose among cuts.

At 806, a set of nodes to be used in a final mapping is returned for the K-bounded AIG. Map derivation for a final mapping at 806 may be performed in a known manner with new information as obtained at 804 or 805.

At 807, LUTs are merged for the K-bounded AIG. Thus LUTs with fewer inputs may be mapped. For example, LUTs with 2, 3, or 4 inputs may be mapped, where previously such LUTs were mapped as 5- or 6-input LUTs.

WireMap flow 800 differs from conventional mappers at least in that it minimizes the total number of edges in a mapped network. As a result of this edge minimization, when targeting large input LUTs such as for example 6-input LUTs, a reduction in the average number of wires or edges in a design may be obtained with minimal or no changes in depth and LUT count.

A reduction in edges leads to an overall reduction in wirelength after placement and routing. Moreover, a targeted minimum channel width may also be reduced. When a fixed channel width is targeted, critical path delay of a routed circuit may also be reduced.

Flow 800 may be used to reduce the number of wires or edges than in traditional baseline mapping or a mapping with structural choices ("MSC"). Furthermore, runtime of WireMap flow 800 may be less than that of an MSC runtime or a conventional baseline mapping runtime. This may be due to a reduction in time to map LUTs with fewer inputs. Furthermore, LUT count may be decreased and design depth may be enhanced by use of WireMap flow 800.

Furthermore, WireMap flow 800 may reduce total wirelength after placement and routing in comparison MSC. Additionally, the minimum channel width to route circuit designs may be reduced by use of WireMap flow 800 in comparison to MSC.

A reduction in wirelength may lead to enhanced design performance and routability. While total wirelength and minimum channel width relate directly to the number of edges in a circuit design, the measurement of critical path delay does not. However, critical path delay may be improved by use of WireMap flow 800. While not wishing to be bound by theory, it is believed that the reason for the critical path delay improvement is a reduction in edge count leading to improved placement quality for critical path components. In some circuit designs, higher fanout of circuit networks in a critical path tend to increase critical path delay. Because WireMap flow 800 and the cost function associated therewith are not fanout-sensitive, critical path delay may enhanced.

By reducing edge cost, WireMap flow 800 may further produce smaller sized LUTs in implementation. This is beneficial to modern FPGA architectures where smaller LUTs may be "merged" together into a single dual output LUT component. This merging was previously described with reference to operation 807 of WireMap flow 800. Thus, after technology mapping, a merge command at 807 may be used to perform a merge operation. Such merge operation may select pairs of nodes of a network to be merged while minimizing total cluster count. The result after LUT merging may be a reduction in the dual-output LUT count as compared to an MSC implementation. By reducing the number of larger input LUTs, such as 6-input and 5-input LUTs, the number of lower input LUTs such as 2-, 3-, and 4-input LUTs may be increased.

It should be appreciated that the edge flow heuristic described herein may be incorporated into FPGA technology mapping. A mapper, namely WireMap flow 800, may be implemented as a computer program product, as generally indicated in FIG. 9.

FIG. 9 is a block diagram of an exemplary embodiment of a computer system 900. Computer system 900 may include a programmed computer 910 coupled to one or more display devices 901, such as Cathode Ray Tube ("CRT") displays, Plasma displays, Liquid Crystal Displays ("LCD"), and to one or more input devices 906, such as a keyboard and a cursor pointing device. Other known configurations of a computer system may be used.

Programmed computer 910 may be programmed with a known operating system, which may be Mac OS, Java Virtual Machine, Linux, Solaris, Unix, or a Windows operating system, among other known platforms. Programmed computer 901 includes a central processing unit (CPU) 904, memory 905, and an input/output ("I/O") interface 902. CPU 904 may be a type of microprocessor known in the art, such as available from IBM, Intel, and Advanced Micro Devices for example. Support circuits (not shown) may include conventional cache, power supplies, clock circuits, data registers, and the like. Memory 905 may be directly coupled to CPU 904 or coupled through I/O interface 902. At least a portion of an operating system may be disposed in memory 905. Memory 905 may include one or more of the following: random access memory, read only memory, magneto-resistive read/write memory, optical read/write memory, cache memory, magnetic read/write memory, and the like, as well as signal-bearing media as described below.

I/O interface 902 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 902 may be coupled to a conventional keyboard, network, mouse, display printer, and interface circuitry adapted to receive and transmit data, such as data files and the like. Notably, programmed computer 910 may be coupled to a number of client computers, server computers, or any combination thereof via a conventional network infrastructure, such as a company's Intranet and/or the Internet, for example, allowing distributed use for interface generation.

Memory 905 may store all or portions of one or more programs or data to implement processes in accordance with one or more aspects of the invention to provide a mapper 920 with one or more aspects as described herein. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of mapper 920, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

Edge flow as described herein produces a higher percentage of smaller LUTs without increasing LUT counts or levels. Smaller LUTs enhance the merging capability for a commercial dual-output LUT, which may translate into CLB savings as fewer CLBs may be used in FPGA component mapping. Furthermore, shorter wirelengths produced by the edge flow described herein may lead to shorter routes and thus lower power consumption. Furthermore, smaller LUTs employed as a result of using WireMap flow 800 of FIG. 8 may be exploited to reduce power after placement and routing by programming of memory values as described in additional detail in "CAD Techniques for Power Optimization in Virtex-5™ FPGA" by S. Gupta, et al., *Proceedings of the IEEE Custom Integrated Circuits Conference*, Sep. 16-19, 2007, pp. 85-88.

Because using an edge flow as described herein leads to smaller sized LUTs while keeping the total number of LUTs relatively unchanged, fewer LUTs may lead to fewer AIG nodes after a mapped network is converted back into an AIG during an iterative computation of structural choices. Thus, edge recovery may have a positive impact on the results of design synthesis. Of course, even though edge flow has been described in terms of FPGA technology mapping, it should be appreciated that edge flow as described herein may be used in other synthesis algorithms to improve routability of designs after mapping.

Even though the above description has been in terms of an AIG, it should be appreciated that cut-based structural mapping may be applied to any K-bounded subject graph. Furthermore, it should be appreciated that the heuristic iterative optimization of a mapping as described herein is "greedy" in the sense that it modifies representative cuts of a node one node at a time in such a way that area of a current mapping is reduced or remains the same.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for mapping for circuit design synthesis, comprising:
   obtaining a subject graph having nodes representing a network;
   determining cuts for each of the nodes;
   determining a minimum depth cut from the cuts for each of the nodes;
   assigning the minimum depth cut respectively associated with each of the nodes as a representative cut thereof;
   updating the representative cut of each of the nodes using a central processing unit;

the updating including running at least one routine selected from a group consisting of a global area edge recovery routine and a local area edge recovery routine;

wherein the global area edge recovery routine and the local area edge recovery routine each applies a heuristic that selects the representative cut of each of the nodes during the updating according to lowest edge count; and outputting a set of the nodes for use in the mapping.

2. The method according to claim 1, wherein the global area edge recovery routine includes a subroutine for calculating a resultant edge flow value for a cut of the cuts, the subroutine including:

determining number of leaves of the cut;
storing the number of the leaves as a first temporary value;
for each leaf of the leaves of the cut:
  determining number of fanouts;
  if the number of fanouts equals 0, setting the number of fanouts to equal 1;
  obtaining an interim edge flow value of the cut; and
  dividing the interim edge flow value by the number of fanouts associated therewith to provide a partial result;
adding together the partial result for each of the leaves to provide a second temporary value;
adding the first temporary value and the second temporary value to produce the resultant edge flow value; and
storing the resultant edge flow value in association with the cut.

3. The method according to claim 1, wherein the local area edge recovery routine includes:

in topological order for each of the nodes,
  determining the cuts for minimizing exact area; and
  selecting the representative cut from the cuts, the representative cut being selected for minimizing an exact edge value.

4. The method according to claim 3, wherein the local area edge recovery routine includes a subroutine for calculating the exact edge value, the subroutine including:

performing a depth-first traversal of the network rooted at a cut;
for each leaf of the cut:
  determining if a transitive fanout of the leaf goes to the cut only;
  if the transitive fanout of the leaf goes only to the cut, determining an edge value contribution of the leaf;
  adding the edge value contribution of the leaf to the exact edge value of the cut;
wherein the edge value contribution for all leaves of the cut are recursively added together.

5. The method according to claim 1,
wherein the global area edge recovery routine uses a cost function defining edge flow (EF) as:

$$EF(n) = \frac{\left[\text{Edge}(n) + \sum_i EF(Leaf_i(n))\right]}{NumFanout(n)},$$

for Edge(n) being a total number of fanin edges of a component used to map a cut of a node n, $Leaf_i(n)$ being an i-th leaf of the cut of the node n, and NumFanouts(n) being a number of fanouts of the node n for the mapping of the node n.

6. The method according to claim 1, wherein the global area edge recovery routine and the local area edge recovery routine each applies a first metric in selecting cuts and applies a second metric that is different from the first metric as a tiebreaker in choosing a cut from among the cuts selected using the first metric during the updating; and wherein the second metric comprises the heuristic that selects the representative cut according to lowest edge count.

7. The method according to claim 1, wherein the global area edge recovery routine uses lowest area flow to select cuts and selects a cut having lowest edge flow as a tiebreaker from among the cuts selected using lowest area flow during the updating.

8. The method of claim 1, wherein the local area edge recovery routine uses exact area for a cost function in selecting cuts and chooses a cut having a lowest exact edge count as a tiebreaker from among the cuts selected using the exact area for the cost function.

9. The method according to claim 1, wherein the local area edge recovery routine selects a cut in the updating to minimize exact edge value; and wherein exact edge value is determined, at least in part, by, for each leaf of the cut, selectively adding a contribution of the leaf to the edge count value according to whether a transitive fanout of the leaf goes to the cut only.

10. The method according to claim 1, wherein the global area edge recovery routine calculates a resultant edge flow value for a cut of the cuts; and wherein resultant edge flow is determined, at least in part, by, for each leaf of the leaves of the cut, dividing an interim edge flow value by a number of fanouts associated therewith as a partial result that is added together with the partial result of each of the leaves.

11. A non-transitory machine-readable medium having stored thereon information representing instructions that, when executed by a processor, cause the processor to perform operations comprising:

obtaining a subject graph having nodes representing a network;
determining cuts for each node of the nodes;
determining a minimum depth cut from the cuts for each said node of the nodes;
assigning the minimum depth cut associated with each said node as a representative cut thereof;
updating the representative cut of each said node;
the updating including running at least one routine selected from a group consisting of a global area edge recovery routine and a local area edge recovery routine;
wherein the global area edge recovery routine and the local area edge recovery routine each applies a heuristic selecting the representative cut of each of the nodes during the updating according to lowest edge count; and
outputting a set of the nodes for use in mapping.

12. The medium according to claim 11, wherein the local area edge recovery routine selects a cut in the updating to minimize exact edge value; and wherein exact edge value is determined, at least in part, by, for each leaf of the cut, selectively adding a contribution of the leaf to the edge count value according to whether a transitive fanout of the leaf goes to the cut only.

* * * * *